United States Patent
Moon et al.

(10) Patent No.: US 11,915,632 B2
(45) Date of Patent: Feb. 27, 2024

(54) SIGNAL PROCESSING DEVICE CAPABLE OF REDUCING BREAKDOWN PHENOMENON IN CASE OF POWER OFF OR POWER DOWN, AND IMAGE DISPLAY DEVICE INCLUDING THE SAME

(71) Applicant: LG ELECTRONICS INC., Seoul (KR)

(72) Inventors: Taksu Moon, Seoul (KR); Youngjae Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/904,369

(22) PCT Filed: Feb. 18, 2020

(86) PCT No.: PCT/KR2020/002277
§ 371 (c)(1),
(2) Date: Aug. 16, 2022

(87) PCT Pub. No.: WO2021/167113
PCT Pub. Date: Aug. 26, 2021

(65) Prior Publication Data
US 2023/0067949 A1 Mar. 2, 2023

(51) Int. Cl.
*G09G 3/20* (2006.01)
*H03K 19/20* (2006.01)

(52) U.S. Cl.
CPC .............. *G09G 3/20* (2013.01); *H03K 19/20* (2013.01); *G09G 2310/0259* (2013.01);
(Continued)

(58) Field of Classification Search
None
See application file for complete search history.

(56) References Cited

U.S. PATENT DOCUMENTS

2008/0238481 A1  10/2008  Maede et al.
2013/0162175 A1*  6/2013  Kim ..................... G09G 3/3225
                                                              315/307
(Continued)

FOREIGN PATENT DOCUMENTS

| JP | 2006086892 | 3/2006 |
| JP | 2009194708 | 8/2009 |
| KR | 101918212 | 1/2019 |

OTHER PUBLICATIONS

PCT International Application No. PCT/KR2020/002277, International Search Report dated Nov. 11, 2020, 2 pages.

*Primary Examiner* — Amr A Awad
*Assistant Examiner* — Donna V Bocar
(74) *Attorney, Agent, or Firm* — LEE, HONG, DEGERMAN, KANG & WAIMEY

(57) ABSTRACT

An image display apparatus is disclosed. The image display according to an embodiment of the present disclosure includes a signal processing device including a first logic circuit to process a first voltage range of a voltage level of the input signal, a second logic circuit to process a second voltage range of the voltage level of the input signal, higher than the first voltage range, and a protection control circuit including a protection switch and a protection controller for controlling the protection switch, wherein the protection switch is turned on based on the protection controller being turned off or powered down. Accordingly, a breakdown phenomenon can be reduced in case of power off or power down.

17 Claims, 14 Drawing Sheets

(52) U.S. Cl.
CPC . *G09G 2310/0289* (2013.01); *G09G 2330/00* (2013.01); *G09G 2330/027* (2013.01); *G09G 2330/04* (2013.01); *G09G 2360/10* (2013.01)

(56) References Cited

U.S. PATENT DOCUMENTS

| | | |
|---|---|---|
| 2019/0207378 A1 | 7/2019 | Gan |
| 2021/0043126 A1* | 2/2021 | Kim .......................... G06F 3/02 |
| 2021/0335211 A1* | 10/2021 | Cheng .................... G11C 19/28 |
| 2022/0224107 A1* | 7/2022 | Kim ........................ H02H 7/20 |

* cited by examiner

400

SIGNAL PROCESSING DEVICE CAPABLE OF REDUCING BREAKDOWN PHENOMENON IN CASE OF POWER OFF OR POWER DOWN, AND IMAGE DISPLAY DEVICE INCLUDING THE SAME

CROSS-REFERENCE TO RELATED APPLICATION(S)

This application is the National Stage filing under 35 U.S.C. 371 of International Application No. PCT/KR2020/002277, filed on Feb. 18, 2020, the contents of which are all incorporated by reference herein in its entirety.

BACKGROUND

1. Field

The present disclosure relates to an image display apparatus, and more specifically, to a signal processing device capable of reducing a breakdown phenomenon in case of power off or power down, and an image display apparatus including the same.

2. Description of the Related Art

A signal processing device is a device that is included in an image display apparatus and performs signal processing on an input image so as to display an image.

For example, the signal processing device may receive a broadcast signal or an HDMI signal, performs signal processing based on the received broadcast or HDMI signal, and output a processed image signal.

As another example, the signal processing device receives a signal from an Ethernet terminal or transmits a signal thereto.

Meanwhile, the signal processing device is implemented in the form of a system-on-chip (SOC) for processing of various signals.

For advancement of such an SOC, semiconductor processes are used, and in particular, a CMOS process, which is one of semiconductor processes, is gradually being advanced over time.

In the CMOS process, as the process of PMOS and NMOS devices is refined, the distance between a gate, a drain, and a source decreases and an allowable voltage is lowered.

However, the standard of signals received or transmitted through an Ethernet terminal still requires a high voltage, and when it exceeds an allowable voltage of a signal processing device, reliability becomes problem due to overvoltage stress.

Meanwhile, since an analog circuit has a circuit off situation, it is necessary to solve a reliability problem due to this situation in a micro-process.

SUMMARY

Therefore, the present disclosure has been made in view of the above problems, and it is an object of the present disclosure is to provide an image display apparatus capable of reducing a breakdown phenomenon in case of power off power down.

In accordance with the present disclosure, the above and other objects can be accomplished by the provision of a signal processing device and an image display apparatus including the same, the signal processing device for processing input signals received from an Ethernet terminal including a first logic circuit configured to process a first voltage range among voltage levels of input signals, a second logic circuit configured to process a second voltage range higher than the first voltage range among the voltage levels of the input signals, and a protection control circuit disposed between the first logic circuit and the second logic circuit and including a protection switch and a protection controller for controlling the protection switch, wherein the protection switch is turned on based on the protection controller being turned off or powered down.

In accordance with another aspect of the present disclosure, a signal processing device and an image display apparatus including the same include a first logic circuit configured to process a first voltage range among voltage levels of input signals, a second logic circuit configured to process a second voltage range higher than the first voltage range among the voltage levels of the input signals, and a protection control circuit disposed between the first logic circuit and the second logic circuit and including a protection switch and a protection controller for controlling the protection switch, wherein the voltage levels of the input signals are greater than an internal allowable voltage level, and the protection switch is turned on based on the protection controller being turned off or powered down.

Effects of the Disclosure

In the signal processing device and the image display apparatus including the same according to an embodiment of the present disclosure, the signal processing device for processing input signals received from an Ethernet terminal includes the first logic circuit configured to process the first voltage range among voltage levels of input signals, the second logic circuit configured to process the second voltage range higher than the first voltage range among the voltage levels of the input signals, and the protection control circuit disposed between the first logic circuit and the second logic circuit and including the protection switch and the protection controller for controlling the protection switch, wherein the protection switch is turned on based on the protection controller being turned off or powered down. Accordingly, it is possible to reduce a breakdown phenomenon in case of power off or power down. Therefore, it is possible to protect internal circuit elements.

The protection switch may be turned on based on operation power for operating the second logic circuit being applied and operation power being not applied to the protection controller while operation power for operating the protection switch is applied. Accordingly, even when the operation power is not applied to the protection controller, it is possible to reduce a breakdown phenomenon.

The protection switch may be turned on based on an input digital signal in case in which the operation power for operating the protection switch, the operation power for operating the second logic circuit, and the operation power for the protection controller are applied. Accordingly, it is possible to reduce a breakdown phenomenon in case of power off or power down.

The protection switch may be turned off based on the operation power for operating the protection switch, the operation power for operating the second logic circuit, and the operation power for the protection controller being applied. Accordingly, when the operation power is applied to the protection controller, the circuit operation can be stably performed.

The protection controller may output a low-level signal to the protection switch based on the operation power for operating the second logic circuit being applied and the operation power being not applied to the protection controller while the operation power for operating the protection switch is applied. Accordingly, it is possible to reduce a breakdown phenomenon in case of power off or power down.

The protection controller may output a signal corresponding to a level of an input digital signal to the protection switch based on the operation power for operating the protection switch, the operation power for operating the second logic circuit, and the operation power for the protection controller being applied. Accordingly, it is possible to reduce a breakdown phenomenon in case of power off or power down.

The protection controller may output a high-level signal to the protection switch based on the operation power for operating the protection switch, the operation power for operating the second logic circuit, and the operation power for the protection controller being applied. Accordingly, it is possible to reduce a breakdown phenomenon in case of power off or power down.

The protection controller may include a level shifter to which the operation power for operating the protection controller is supplied, a switching element configured to perform switching based on the operation power for operating the protection switch, and a ramp generator configured to output a high-level signal or a low-level signal based on an output of the level shifter, and may output a control output signal as an output signal based on the high-level or low-level signal output from the ramp generator. Accordingly, it is possible to reduce a breakdown phenomenon in case of power off or power down.

The ramp generator may include a comparator and logic circuit elements and output a low level or a high level based on the operation power for operating the protection controller and the operation power for operating the protection switch. Accordingly, it is possible to reduce a breakdown phenomenon in case of power off or power down.

The ramp generator may output a high level based on the operation power for operating the protection switch being applied and the operation power being not applied to the protection controller. Accordingly, it is possible to reduce a breakdown phenomenon in case of power off or power down.

The ramp generator may output a low level based on the operation power for operating the protection switch being applied and the operation power being applied to the protection controller. Accordingly, it is possible to reduce a breakdown phenomenon in case of power off or power down.

The signal processing device and the image display apparatus including the same according to another embodiment of the present disclosure include a first logic circuit configured to process a first voltage range among voltage levels of input signals, a second logic circuit configured to process a second voltage range higher than the first voltage range among voltage levels of input signals, and a protection control circuit disposed between the first logic circuit and the second logic circuit and including a protection switch and a protection controller for controlling the protection switch, wherein the voltage levels of the input signals are greater than an internal allowable voltage level, and the protection switch is turned on based on the protection controller being turned off or powered down. Accordingly, it is possible to reduce a breakdown phenomenon in case of power off or power down. Therefore, it is possible to protect internal circuit elements.

The protection switch may be turned on based on operation power for operating the second logic circuit being applied and the operation power being not applied to the protection controller. Accordingly, it is possible to reduce a breakdown phenomenon in case of power off or power down.

The protection switch may be turned on based on an input digital signal in case in which the operation power for operating the protection switch, the operation power for operating the second logic circuit, and the operation power for the protection controller are applied. Accordingly, it is possible to reduce a breakdown phenomenon in case of power off or power down.

The protection switch may be turned off based on the operation power for operating the protection switch, the operation power for operating the second logic circuit, and the operation power for the protection controller being applied. Accordingly, it is possible to reduce a breakdown phenomenon in case of power off or power down.

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
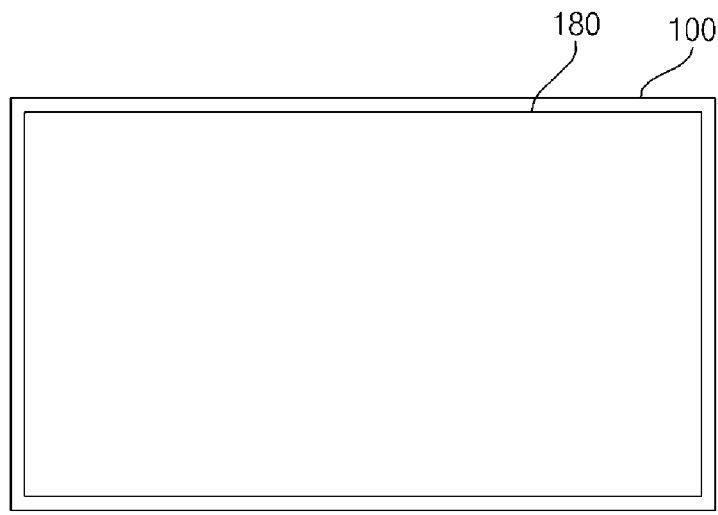
FIG. 1 is a diagram showing an image display apparatus according to an embodiment of the present disclosure.

FIG. 1 is a diagram showing an image display apparatus according to an embodiment of the present disclosure.

Referring to the drawing, an image display apparatus 100 may include a display 180.

The display 180 may be implemented with any one of various panels. For example, the display 180 may be any one of a liquid crystal display panel (LCD panel), an organic light emitting diode panel (OLED panel), an inorganic light emitting diode panel (LED panel).

Meanwhile, the image display apparatus 100 in FIG. 1 may be a monitor, a TV, a tablet PC, a mobile terminal, a display for a vehicle, etc.

Figure 2:
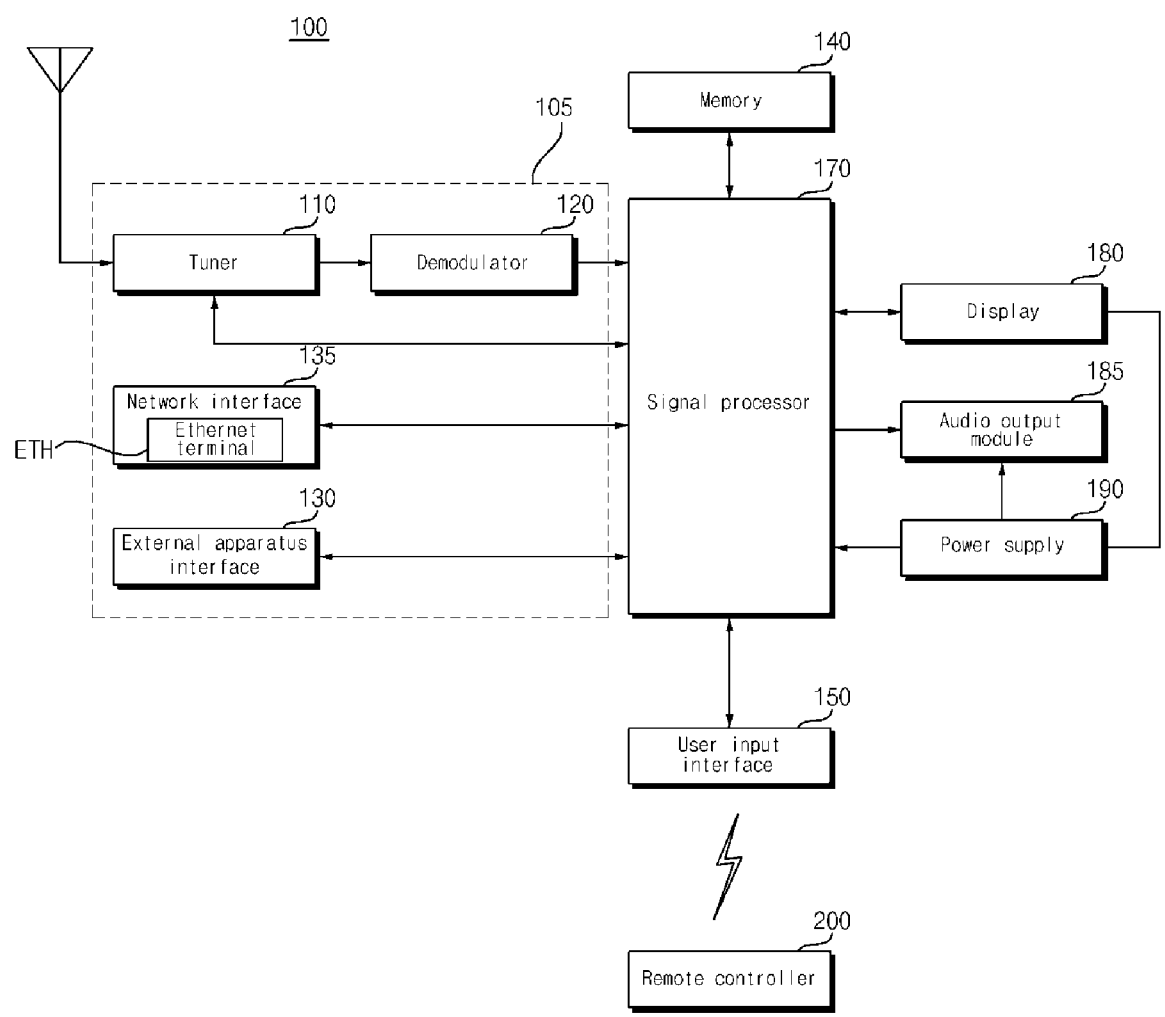
FIG. 2 is an example of an internal block diagram of the image display apparatus of FIG. 1.

FIG. 2 is an example of an internal block diagram of the image display apparatus of FIG. 1.

Referring to FIG. 2, the image display apparatus 100 according to an embodiment of the present disclosure includes an image receiver 105, an external apparatus interface 130, a memory 140, a user input interface 150, a sensor device (not shown), a signal processor 170, a display 180, and an audio output module 185.

The image receiver 105 may include a tuner 110, a demodulator 120, a network interface 135, and an external apparatus interface 130.

Meanwhile, unlike the drawing, the image receiver 105 may include only the tuner 110, the demodulator 120, and the external apparatus interface 130. That is, the network interface 135 may not be included.

The tuner 110 selects an RF broadcast signal corresponding to a channel selected by a user or all prestored channels among radio frequency (RF) broadcast signals received through an antenna (not shown). In addition, the selected RF broadcast signal is converted into an intermediate frequency signal, a baseband image, or an audio signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner 110 can process a digital broadcast signal or an analog broadcast signal. The analog baseband image or audio signal (CVBS/SIF) output from the tuner 110 may be directly input to the signal processor 170.

Meanwhile, the tuner 110 can include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner 110 and performs a demodulation operation.

The demodulator 120 may perform demodulation and channel decoding and then output a stream signal TS. At this time, the stream signal may be a multiplexed signal of an image signal, an audio signal, or a data signal.

The stream signal output from the demodulator 120 may be input to the signal processor 170. The signal processor 170 performs demultiplexing, image/audio signal processing, and the like, and then outputs an image to the display 180 and outputs audio to the audio output module 185.

The external apparatus interface 130 may transmit or receive data with a connected external apparatus (not shown), e.g., a settop box 50. To this end, the external apparatus interface 130 may include an A/V input and output module (not shown).

The external apparatus interface 130 may be connected in wired or wirelessly to an external apparatus such as a digital versatile disk (DVD), a Blu ray, a game equipment, a camera, a camcorder, a computer (note book), and a settop box, and may perform an input/output operation with an external apparatus.

The A/V input and output module may receive image and audio signals from an external apparatus. Meanwhile, a wireless communicator (not shown) may perform short range wireless communication with other electronic apparatus.

Through the wireless communicator (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network.

For example, the network interface 135 may receive various types of data received through an Ethernet terminal (ETH) network or transmit the same to the outside.

Meanwhile, the network interface 135 may include a wireless communicator (not shown).

The memory 140 may store a program for each signal processing and control in the signal processor 170, and may store signal processed image, audio, or data signal.

In addition, the memory 140 may serve to temporarily store image, audio, or data signal input to the external apparatus interface 130. In addition, the memory 140 may store information on a certain broadcast channel through a channel memory function such as a channel map.

Although FIG. 2 illustrates that the memory is provided separately from the signal processor 170, the scope of the present disclosure is not limited thereto. The memory 140 may be included in the signal processor 170.

The user input interface 150 transmits a signal input by the user to the signal processor 170 or transmits a signal from the signal processor 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the signal processor 170, may transfer a user input signal input from a sensor device (not shown) that senses a user's gesture to the signal processor 170, or may transmit a signal from the signal processor 170 to the sensor device (not shown).

The signal processor 170 may demultiplex the input stream through the tuner 110, the demodulator 120, the network interface 135, or the external apparatus interface 130, or process the demultiplexed signals to generate and output a signal for image or audio output.

For example, the signal processor 170 receives a broadcast signal received by the image receiver 105 or an HDMI signal, and perform signal processing based on the received broadcast signal or the HDMI signal to thereby output a processed image signal.

The image signal processed by the signal processor 170 is input to the display 180, and may be displayed as an image corresponding to the image signal. In addition, the image signal processed by the signal processor 170 may be input to the external output apparatus through the external apparatus interface 130.

The audio signal processed by the signal processor 170 may be output to the audio output module 185 as an audio signal. In addition, audio signal processed by the signal processor 170 may be input to the external output apparatus through the external apparatus interface 130.

Although not shown in FIG. 2, the signal processor 170 may include a demultiplexer, an image processor, and the like.

That is, the signal processor 170 may perform a variety of signal processing and thus it may be implemented in the form of a system on chip (SOC). This will be described later with reference to FIG. 3.

In addition, the signal processor 170 can control the overall operation of the image display apparatus 100. For example, the signal processor 170 may control the tuner 110 to control the tuning of the RF broadcast corresponding to the channel selected by the user or the previously stored channel.

In addition, the signal processor 170 may control the image display apparatus 100 according to a user command input through the user input interface 150 or an internal program.

Meanwhile, the signal processor 170 may control the display 180 to display an image. At this time, the image displayed on the display 180 may be a still image or a moving image, and may be a 2D image or a 3D image.

Meanwhile, the signal processor 170 may display a certain object in an image displayed on the display 180. For example, the object may be at least one of a connected web screen (newspaper, magazine, etc.), an electronic program guide (EPG), various menus, a widget, an icon, a still image, a moving image, and a text.

Meanwhile, the signal processor 170 may recognize the position of the user based on the image photographed by a photographing device (not shown). For example, the distance (z-axis coordinate) between a user and the image display apparatus 100 can be determined. In addition, the x-axis coordinate and the y-axis coordinate in the display 180 corresponding to a user position can be determined.

The display 180 generates a driving signal by converting an image signal, a data signal, an OSD signal, a control signal processed by the signal processor 170, an image signal, a data signal, a control signal, and the like received from the external apparatus interface 130.

Meanwhile, the display 180 may be configured as a touch screen and used as an input device in addition to an output device.

The audio output module 185 receives a signal processed by the signal processor 170 and outputs it as an audio.

The photographing device (not shown) photographs a user. The photographing device (not shown) may be implemented by a single camera, but the present disclosure is not limited thereto and may be implemented by a plurality of cameras. Image information photographed by the photographing device (not shown) may be input to the signal processor 170.

The signal processor 170 may sense a gesture of the user based on each of the images photographed by the photographing device (not shown), the signals detected from the sensor device (not shown), or a combination thereof.

The power supply 190 supplies corresponding power to the image display apparatus 100. Particularly, the power may be supplied to a controller 170 which can be implemented in the form of a system on chip (SOC), a display 180 for displaying an image, and an audio output module 185 for outputting an audio.

Specifically, the power supply 190 may include a converter for converting an AC power into a DC power, and a DC/DC converter for converting the level of the DC power.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150, and display it on the remote controller 200 or output it as an audio.

Meanwhile, the image display apparatus 100 may be a fixed or mobile digital broadcasting receiver capable of receiving digital broadcasting.

Meanwhile, a block diagram of the image display apparatus 100 shown in FIG. 2 is a block diagram for an embodiment of the present disclosure. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present disclosure, and specific operation and apparatus do not limit the scope of the present disclosure.

Figure 3:
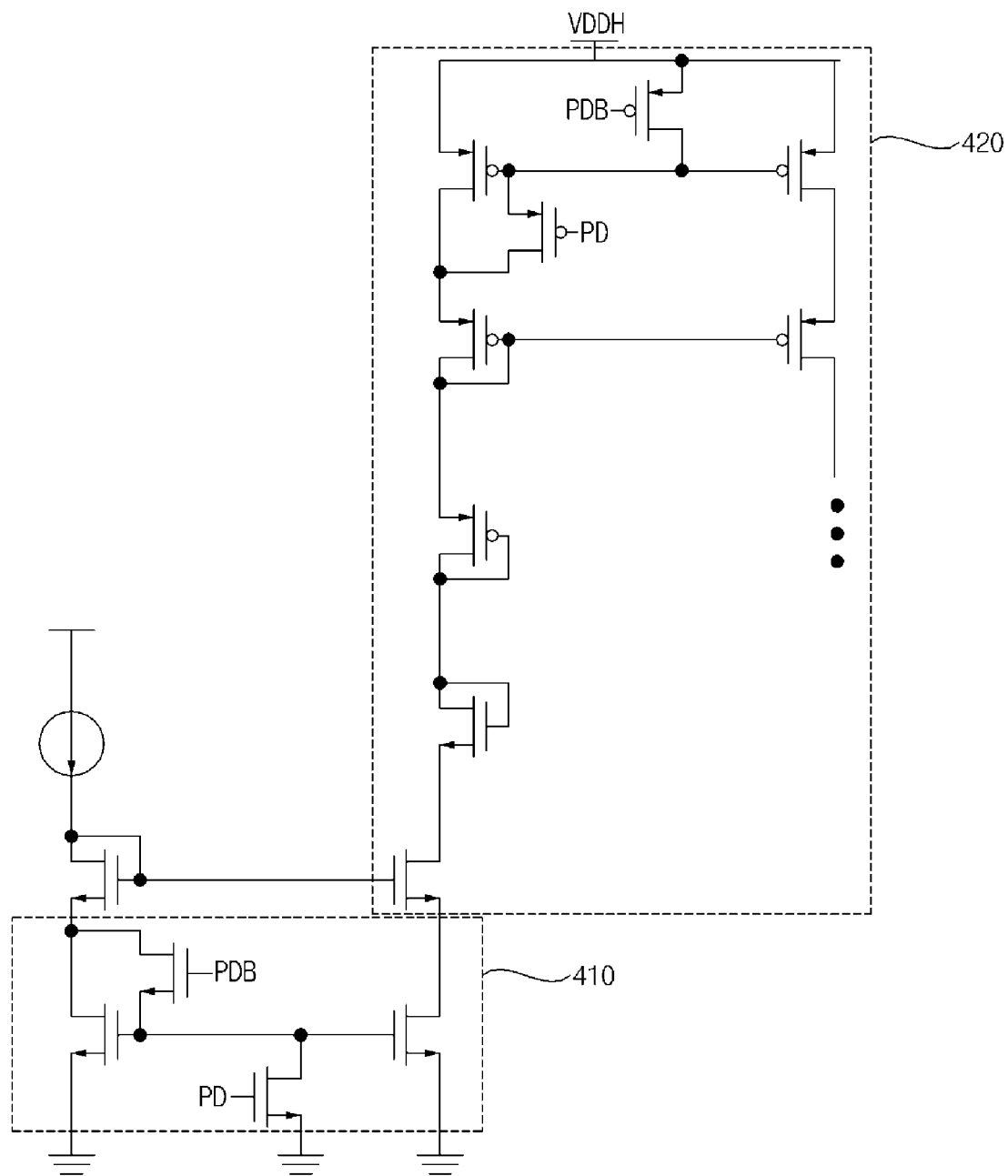
FIG. 3 is an example of an internal block diagram of the signal processor in FIG. 2.

FIG. 3 is an example of an internal block diagram of the signal processor in FIG. 2.

Referring to the drawing, the signal processor 170 according to an embodiment of the present disclosure may include a demultiplexer 310, an image processor 320, a processor 330, and an audio processor 370. In addition, the signal processor 170 may further include and a data processor (not shown).

The demultiplexer 310 demultiplexes the input stream. For example, when an MPEG-2 TS is input, it can be demultiplexed into image, audio, and data signal, respectively. Here, the stream signal input to the demultiplexer 310 may be a stream signal output from the tuner 110, the demodulator 120, or the external apparatus interface 130.

The image processor 320 may perform signal processing on an input image. For example, the image processor 320 may perform image processing on an image signal demultiplexed by the demultiplexer 310.

To this end, the image processor 320 may include an image decoder 325, a scaler 335, an image quality processor 635, an image encoder (not shown), an OSD processor 340, a frame rate converter 350, a formatter 360, etc.

The image decoder 325 decodes a demultiplexed image signal, and the scaler 335 performs scaling so that the resolution of the decoded image signal can be output from the display 180.

The image decoder 325 can include a decoder of various standards. For example, a 3D image decoder for MPEG-2, H.264 decoder, a color image, and a depth image, and a decoder for a multiple view image may be provided.

The scaler 335 may scale an input image signal decoded by the image decoder 325 or the like.

For example, if the size or resolution of an input image signal is small, the scaler 335 may upscale the input image signal, and, if the size or resolution of the input image signal is great, the scaler 335 may downscale the input image signal.

The image quality processor 635 may perform image quality processing on an input image signal decoded by the image decoder 325 or the like.

For example, the image quality processor 625 may perform noise reduction processing on an input image signal, extend a resolution of high gray level of the input image signal, perform image resolution enhancement, perform signal processing based on high dynamic range (HDR), change a frame rate, perform image quality processing suitable for properties of a panel, especially an OLED panel, etc.

The OSD processor 340 generates an OSD signal according to a user input or by itself. For example, based on a user input signal, the OSD processor 340 may generate a signal for displaying various pieces of information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD processor 340 may generate a pointer that can be displayed on the display, based on a pointing signal input from the remote controller 200. In particular, such a pointer may be generated by a pointing signal processor, and the OSD processor 340 may include such a pointing signal processor (not shown). Obviously, the pointing signal processor (not shown) may be provided separately from the OSD processor 340.

A frame rate converter (FRC) 350 may convert a frame rate of an input image. The FRC 350 may output the input image without changes.

Meanwhile, the formatter 360 may change a format of an input image signal into a format suitable for displaying the image signal on a display and output the image signal in the changed format.

In particular, the formatter 360 may change a format of an image signal to correspond to a display panel.

Meanwhile, the formatter 360 may change the format of the image signal. For example, it may change the format of the 3D image signal into any one of various 3D formats such as a side by side format, a top/down format, a frame sequential format, an interlaced format, a checker box format, and the like.

The processor 330 may control overall operations of the image display apparatus 100 or the signal processor 170.

For example, the processor 330 may control the tuner 110 to control the tuning of an RF broadcast corresponding to a channel selected by a user or a previously stored channel.

In addition, the processor 330 may control the image display apparatus 100 according to a user command input through the user input interface 150 or an internal program.

In addition, the processor 330 may transmit data to the network interface 135 or to the external apparatus interface 130.

In addition, the processor 330 may control the demultiplexer 310, the image processor 320, and the like in the signal processor 170.

Meanwhile, the audio processor 370 in the signal processor 170 may perform the audio processing of the demultiplexed audio signal. To this end, the audio processor 370 may include various decoders.

In addition, the audio processor 370 in the signal processor 170 may process a base, a treble, a volume control, and the like.

The data processor (not shown) in the signal processor 170 may perform data processing of the demultiplexed data signal. For example, when the demultiplexed data signal is a coded data signal, it can be decoded. The encoded data signal may be electronic program guide information including broadcast information such as a start time and an end time of a broadcast program broadcasted on each channel.

Meanwhile, a block diagram of the signal processor 170 shown in FIG. 3 is a block diagram for an embodiment of the present disclosure. Each component of the block diagram may be integrated, added, or omitted according to a specification of the signal processor 170 actually implemented.

In particular, the frame rate converter 350 and the formatter 360 may be provided separately in addition to the image processor 320.

Meanwhile, a signal received through the Ethernet terminal ETH may be about 2.5 V or higher according to a standard or the like.

The signal processor 170 is manufactured by a nano-process or the like, and thus an internal allowable voltage is approximately 1.8 V. Therefore, when a voltage signal higher than the internal allowable voltage is input to the signal processor 170 according to the standard, stress applied to the signal processor 170 increases and thus the operation thereof may not be smoothly performed.

Accordingly, when the voltage of an external input signal is higher than the allowable voltage in the signal processor, it is desirable to divide and process the voltage level of the external input signal.

Figure 4A:
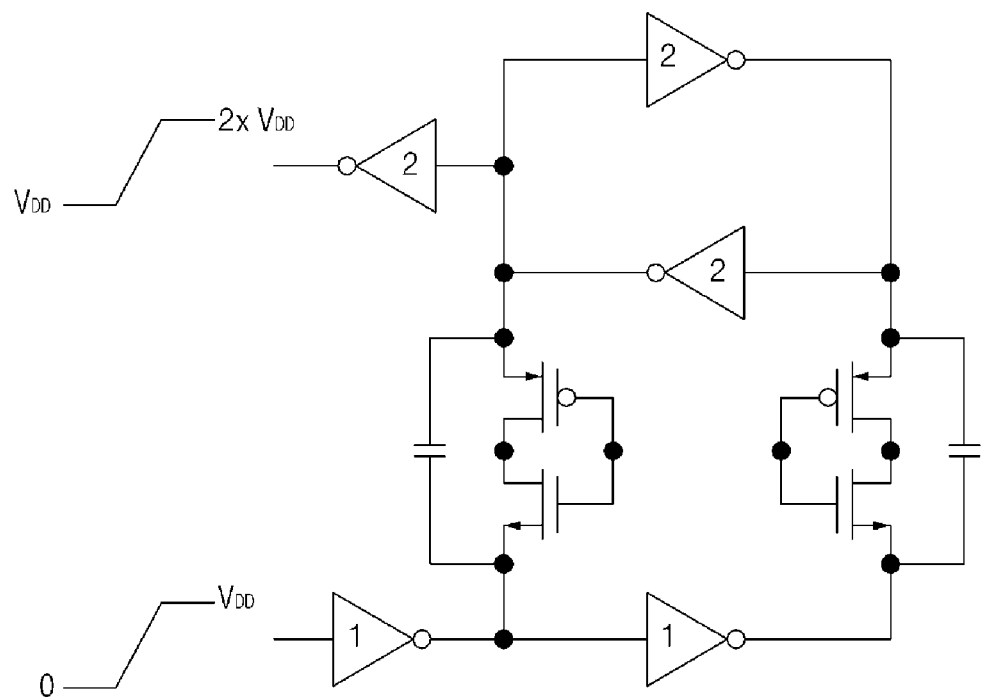
FIG. 4A illustrates an example of a level shifter for processing a signal received through an Ethernet terminal.

FIG. 4A illustrates an example of a level shifter for processing a signal received through an Ethernet terminal.

Referring to the figure, the level shifter 400 divides the voltage level of a signal received through the Ethernet terminal into two regions and processes the same such that the voltage level does not exceed the internal allowable voltage of the signal processor 170.

For example, the low voltage region may be between 0 V and a voltage VDD and the high voltage region may be between voltages VDD and 2VDD.

The level shifter 400 uses a first logic circuit (1-logic) for the low voltage region and uses a second logic circuit (2-logic) for the high voltage region.

According to the level shifter 400, since the first logic circuit and the second logic circuit are used during circuit operation, the breakdown phenomenon is reduced.

However, when the level shifter 400 is turned off or powered down, the allowable voltage is exceeded due to a floating phenomenon in elements outside the first logic circuit and the second logic circuit, resulting in occurrence of breakdown phenomenon.

Figure 4B:
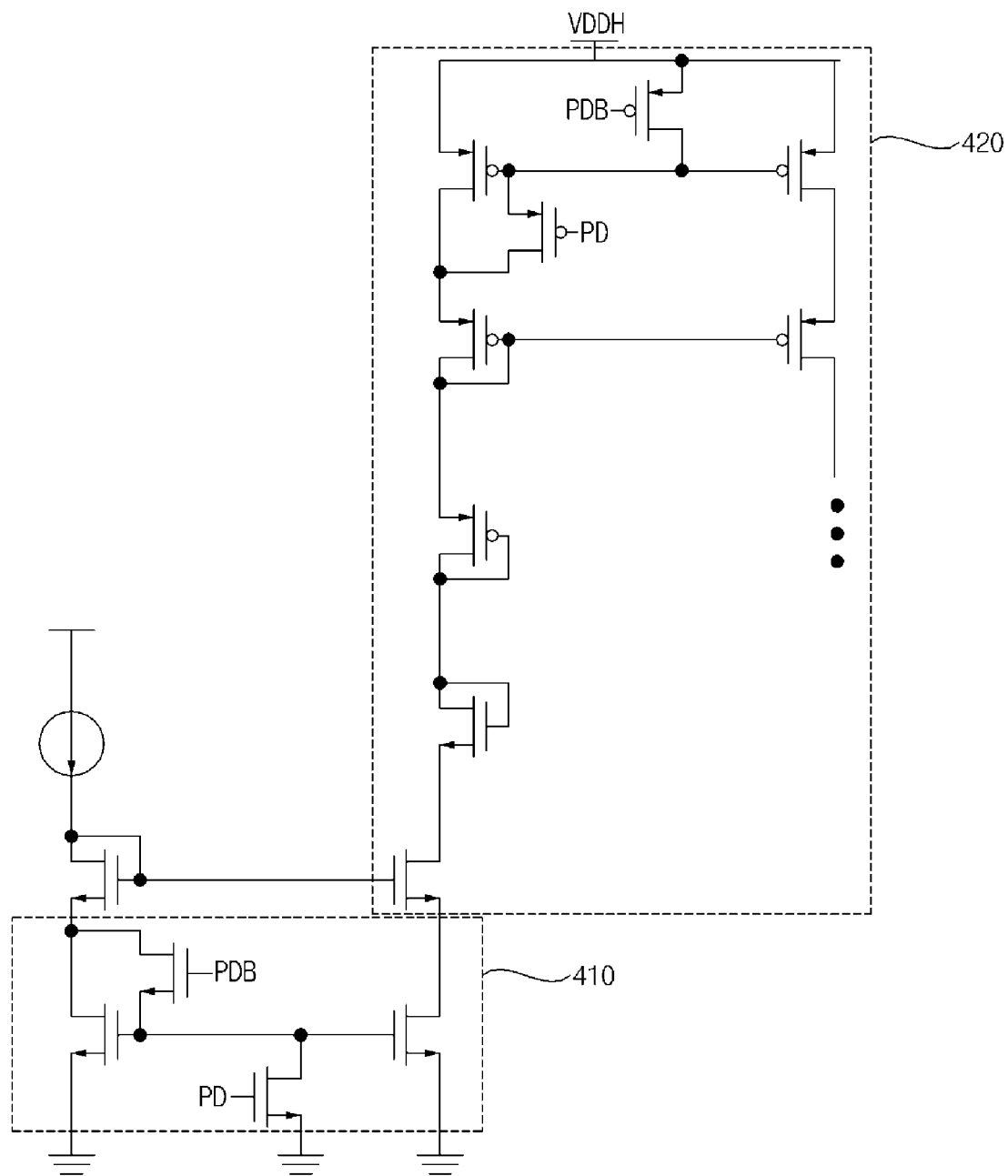
FIG. 4B illustrates another example of a level shifter for processing a signal received through an Ethernet terminal.

FIG. 4B illustrates another example of a level shifter for processing a signal received through an Ethernet terminal.

Referring to the figure, the level shifter 405 divides the voltage level of a signal received through the Ethernet terminal ETH into two regions and processes the same such that the voltage level does not exceed the allowable voltage of the signal processing device.

For example, the low voltage region may be between 0 V and the voltage VDD and the high voltage region may be between voltages VDD and 2VDD.

Specifically, the level shifter 405 uses a first logic circuit 410 for the low voltage region and uses a second logic circuit 420 for the high voltage region.

According to the level shifter 405, since the first logic circuit 410 and the second logic circuit 420 are used during circuit operation, the breakdown phenomenon is reduced.

However, when the level shifter 405 is turned off or powered down, the allowable voltage is exceeded due to a floating phenomenon in elements outside the first logic circuit 410 and the second logic circuit 420, resulting in occurrence of breakdown phenomenon.

Figure 5:
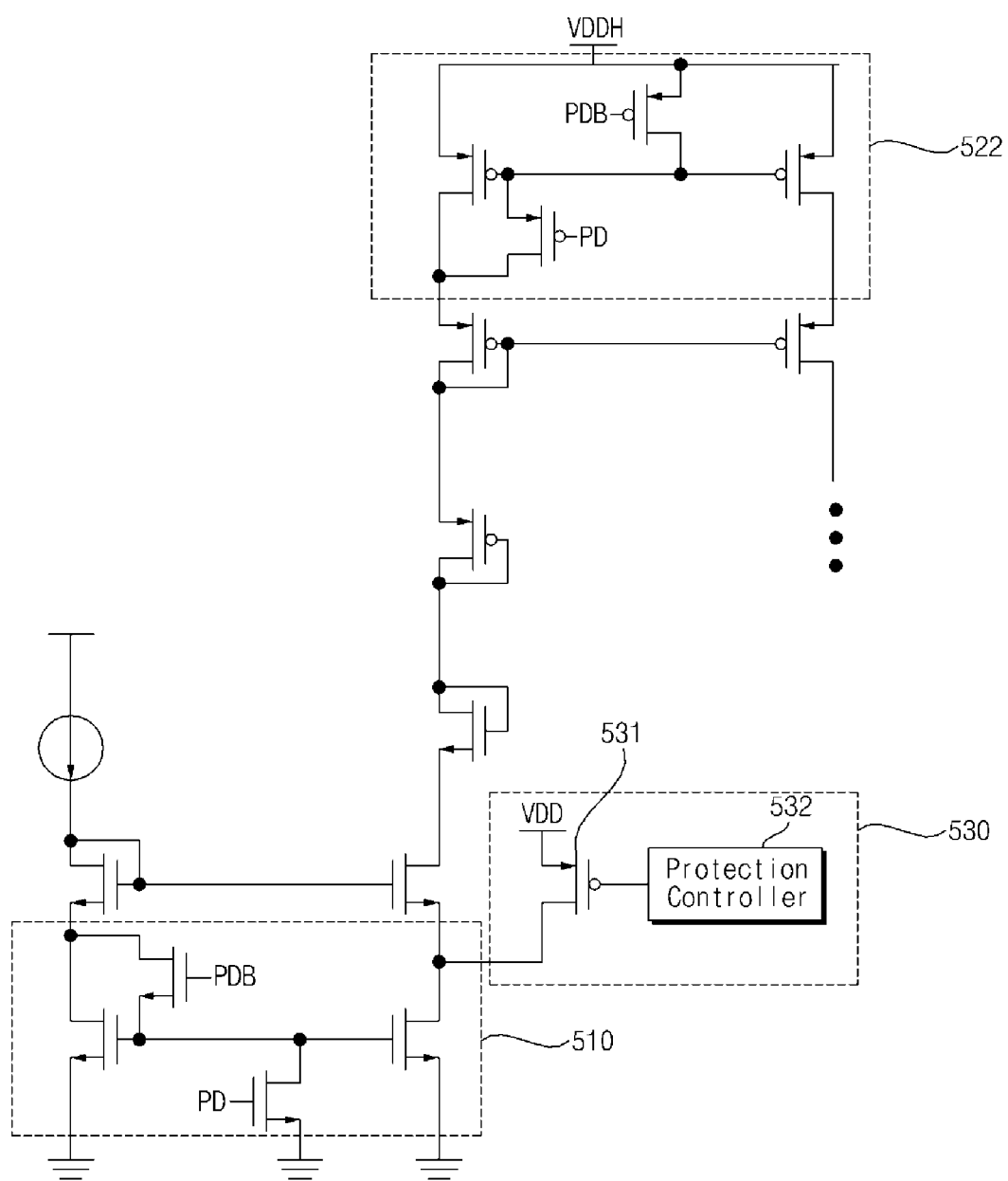
FIG. 5 illustrates a level shifter for processing a signal received through an Ethernet terminal according to an embodiment of the present disclosure.

FIG. 5 illustrates a level shifter for processing a signal received through an Ethernet terminal according to an embodiment of the present disclosure.

Referring to the figure, the level shifter 505 of FIG. 5 includes a first logic circuit 510 for processing a low voltage region between 0 V and a voltage VDD, similar to the level shifter 405 of FIG. 4B, and a second logic circuit 522 for processing a high voltage region between voltages VDD and 2VDD.

Unlike the level shifter 405 of FIG. 4B, the level shifter 505 of FIG. 5 may further include a protection control circuit 530 provided between the first logic circuit 510 and the second logic circuit 522. can do.

That is, when the level shifter 505 is turned off or powered down, the protection control circuit 530 may include a protection switch 531 and a protection controller 532 for controlling the protection switch 531 in order to reduce a breakdown phenomenon due to floating of external elements.

According to the protection switch 531 of FIG. 5, voltages applied to elements located above and below do not exceed the allowable voltage based on a voltage supplied through the protection switch 531, and thus the breakdown phenomenon can be eliminated.

Figure 6:
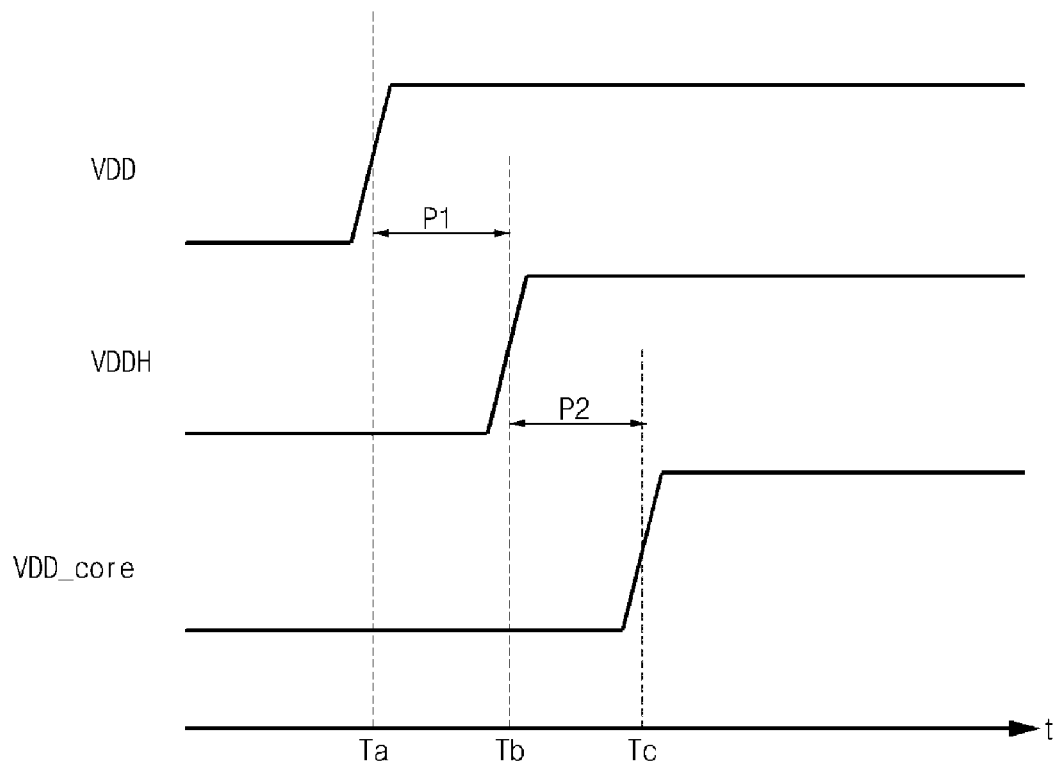
FIG. 6 is a diagram illustrating an example of a power sequence of the level shifter of FIG. 5.

FIG. 6 is a diagram illustrating an example of a power sequence of the level shifter of FIG. 5.

Referring to the figure, VDD may correspond to the operation power of the protection switch 531, VDDH may correspond to the operation power of the second logic circuit 522 for processing a high voltage region, and VDD_core may correspond to the operation power of the protection controller 532.

As shown in the figure, a time difference P1 occurs between a time Ta at which VDD changes from a low level to a high level and a time Tb at which VDDH changes from a low level to a high level, and a time difference P2 occurs between the time Tb at which VDDH changes from the low level to the high level and a time Tc at which VDD_core changes from a low level to t high level.

Accordingly, when the power sequence is supplied as shown in FIG. 6, the protection controller 532 does not operate normally until the period P1+P2, and as VDDH is supplied first, a breakdown phenomenon occurs between the actual elements.

Therefore, it is desirable that the protection controller 532 be in a state in which it can operate the protection switch 531 even before VDDH is supplied, and it is desirable that the protection controller 532 operate according to a digital signal when VDD_core is supplied after VDDH is supplied.

Therefore, according to an embodiment of the present disclosure, the protection switch 531 is turned on when the protection controller 532 is turned off or powered down. Accordingly, it is possible to reduce the breakdown phenomenon in case of power off or power down. Therefore, it is possible to protect internal circuit elements.

Meanwhile, the operation power VDDH for operating the second logic circuit 522 may be applied while the operation power VDD for operating the protection switch 531 is applied, and the protection switch 531 may be turned on when the operation power VDD_core is not applied to the protection controller 532. Accordingly, even when the operation power VDD_core is not applied to the protection controller 532, the breakdown phenomenon can be reduced.

Meanwhile, when the operation power VDD for operating the protection switch 531, the operation power VDDH for operating the second logic circuit 522, and the operation power VDD_core for operating the protection controller 532 are applied, the protection switch 531 may be turned on based on an input digital signal. Accordingly, it is possible to reduce the breakdown phenomenon in case of power off or power down.

On the other hand, when the operation power VDD for operating the protection switch 531, the operation power VDDH for operating the second logic circuit 522, and the operation power VDD_core for operating the protection controller 532 are applied, the protection switch 531 may be turned off. Accordingly, when the operation power VDD_core is applied to the protection controller 532, circuit operation can be stably performed.

The protection controller 532 may output a low-level signal to the protection switch 531 when the operation power VDDH for operating the second logic circuit 522 is applied and the operation power VDD_core is not applied to the protection controller 532 while the operation power VDD for operating the protection switch 531 is applied. Accordingly, it is possible to reduce the breakdown phenomenon in case of power off or power down.

Further, the protection controller 532 may output a signal corresponding to the level of an input digital signal to the protection switch 531 when the operation power VDD for operating the protection switch 531, the operation power VDDH for operating the second logic circuit 522, and the operation power VDD_core for operating the protection controller 532 are applied. Accordingly, it is possible to reduce the breakdown phenomenon in case of power off or power down.

Further, the protection controller 532 may output a high-level signal to the protection switch 531 when the operation power VDD for operating the protection switch 531, the operation power VDDH for operating the second logic circuit 522, and the operation power VDD_core for operating the protection controller 532 are applied. Accordingly, it is possible to reduce the breakdown phenomenon in case of power off or power down.

Figure 7A:
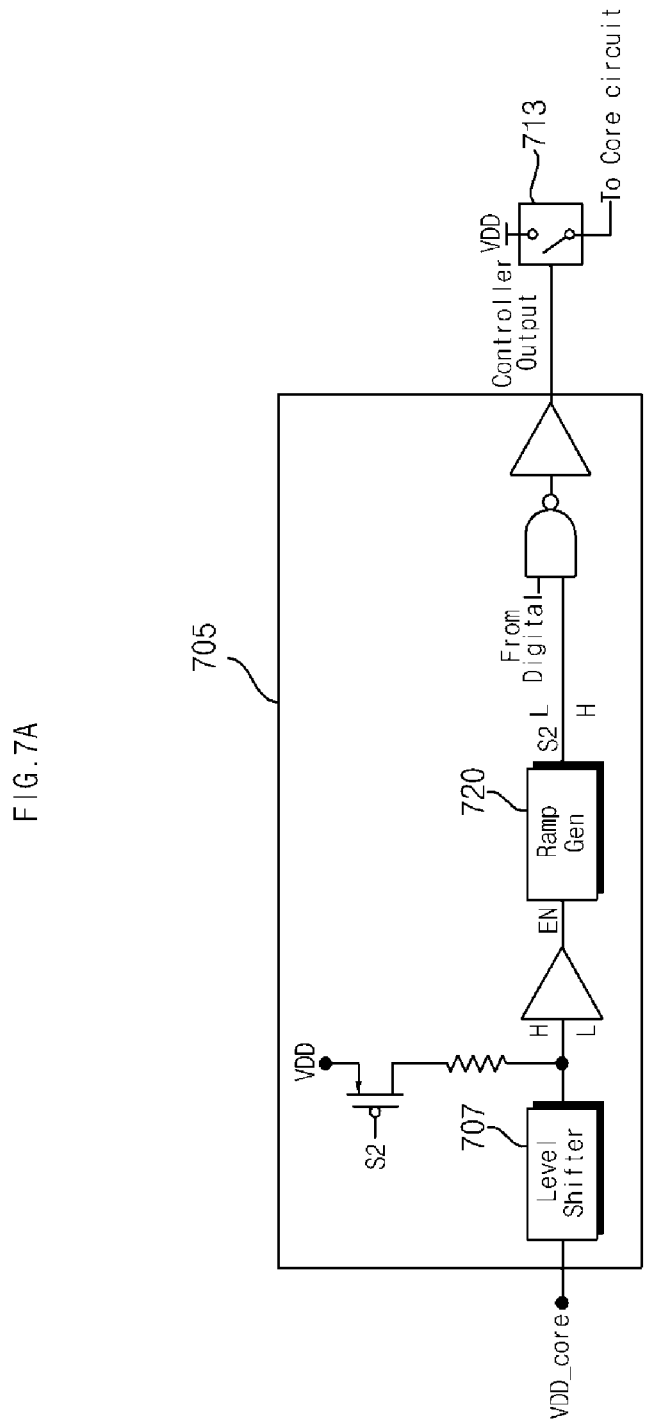
FIG. 7A is an example of a circuit diagram of a protection controller of FIG. 5.
Figure 7B:
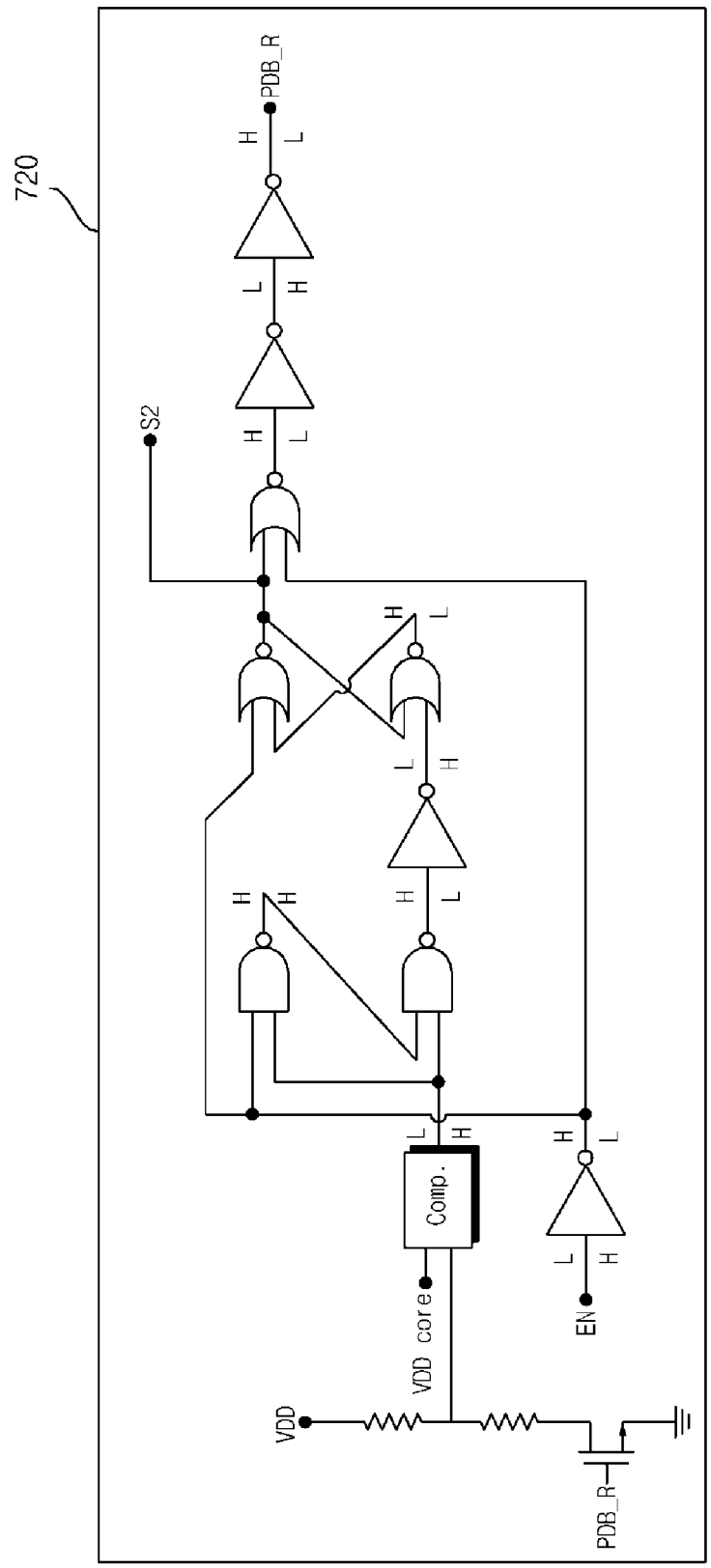
FIG. 7B is an example of a circuit diagram of a ramp generator of FIG. 7A.

FIG. 7A is an example of a circuit diagram of the protection controller of FIG. 5, and FIG. 7B is an example of a circuit diagram of a ramp generator of FIG. 7A.

Referring to the figures, a protection controller 705 of FIG. 7A includes a level shifter 707 to which VDD_core is supplied, a switching element S2 that performs switching based on the voltage VDD, and a ramp generator 720 that outputs a high-level signal or a low-level signal based on the output of the level shifter 707.

In addition, the protection controller 705 may output a control output signal as an output signal based on the high-level or low-level output signal of the ramp generator 720.

Further, the control output signal output from the protection controller 705 may be transmitted to a core circuit by a switching element 713.

Meanwhile, the ramp generator 720 of FIG. 7B includes a comparator comp and logic circuit elements and outputs a low level or a high level according to supply of VDD and VDD_core.

Specifically, when VDD is supplied, the comparator comp outputs a low level, and the ramp generator 720 finally outputs a high-level signal through a plurality of logic circuit elements.

When VDD_core is supplied, the comparator comp outputs a high level, and the ramp generator 720 finally outputs a low-level signal through the plurality of logic circuit elements.

As shown in FIG. 6, when VDD is applied at the high level during the period P1, the comparator comp outputs a low level and the ramp generator 720 outputs a high level.

In addition, in the protection controller 705, a NAND gate operates based on the high level output signal and a digital signal, and accordingly, the protection switch 531 operates based on the control output signal output from the protection controller 705.

That is, as VDD_core is supplied, the protection controller 532 operates by the digital signal.

On the other hand, when VDD_core is not supplied, the ramp generator 720 is turned off, and thus leakage current is not generated and thus the protection switch 531 does not operate.

Figure 8:
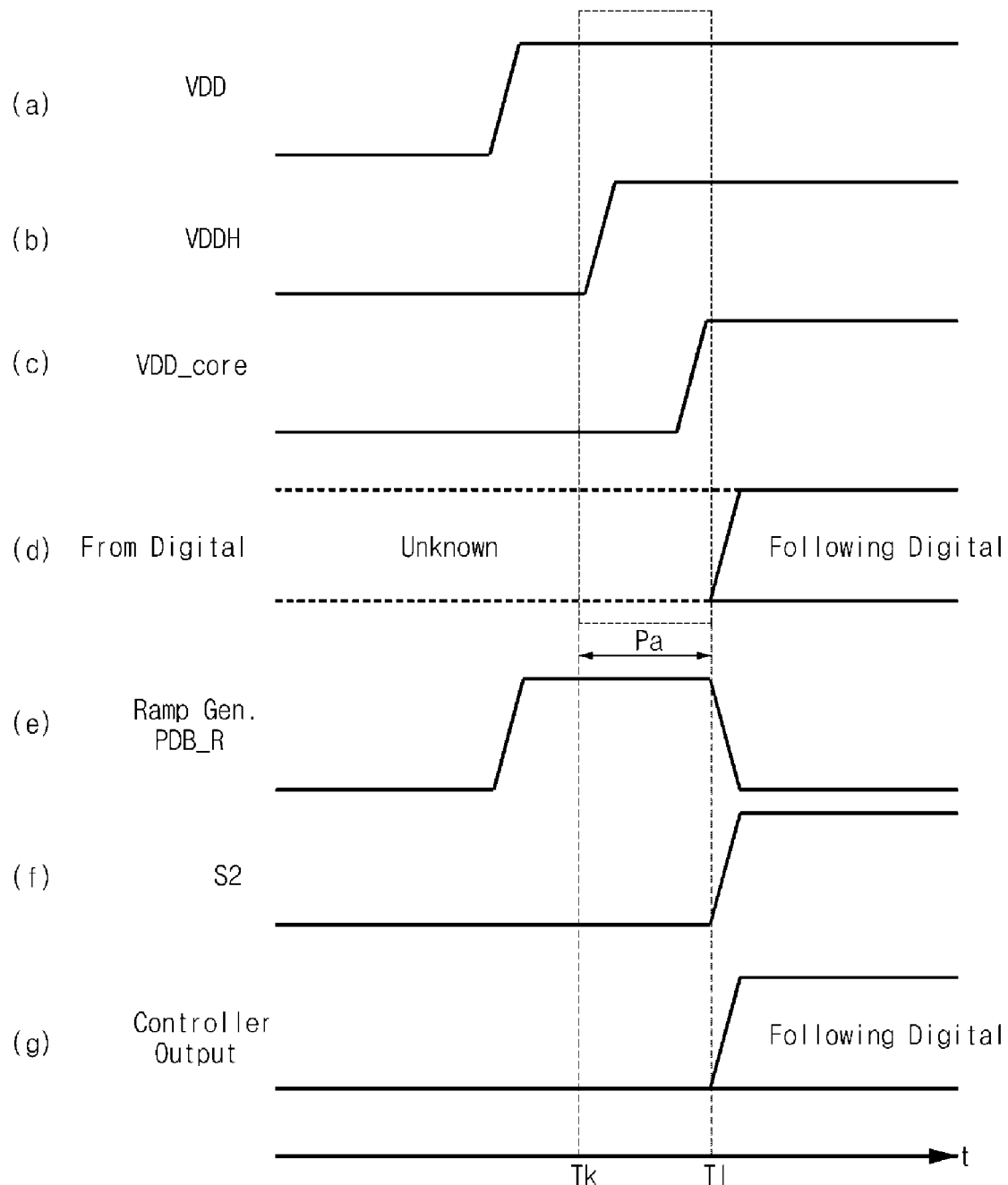
FIG. 8 is a timing diagram of the operation of the protection controller of FIG. 7A.

FIG. 8 is a timing diagram of the operation of the protection controller of FIG. 7A.

(a) to (c) of FIG. 8 show the same waveforms as those of VDD, VDDH, and VDD_core of FIG. 6.

(d) of FIG. 8 shows an example of a digital signal.

According to (a) to (d) of FIG. 8, the digital signal maintains a low level in an off state before Pa between a time Tk at which VDDH changes to a high level and a time Tl at which VDD_core changes to a high level.

Accordingly, during the period Pa, a breakdown phenomenon due to floating of an external element occurs.

(e) of FIG. 8 shows a signal applied to a switching element in the ramp generator 720.

In particular, the signal changes from a low level to a high level in response to VDD and changes from the high level to the low level at the time Tl.

(f) of FIG. 8 shows a signal applied to the switching element S2 in the protection controller 705.

In particular, the signal maintains a low level until the time Tl and changes from a low level to a high level at the time Tl.

(g) of FIG. 8 shows an output signal of the protection controller 705.

For example, even if the digital signal is not applied until Tl, the output signal of the protection controller 705 maintains a low level.

In particular, even when the operation power VDD for operating the protection switch 531 changes from the low level to the high level, as shown in (a) of FIG. 8, the output signal of the protection controller 705 maintains the low level.

Further, even if the operation power VDDH for operating the second logic circuit 522 changes from the low level to the high level, as shown in (b) of FIG. 8, the output signal of the protection controller 705 maintains the low level.

When the operation power VDD_core for the protection controller 532 changes from the low level to the high level, as shown in (c) of FIG. 8, the output signal of the protection controller 705 may maintain the high level or the low level according to an input digital signal.

For example, when the operation power VDD_core for the protection controller 532 changes from the low level to the high level, the output signal of the protection controller 705 maintains the high level if then input digital signal maintains a high level.

Accordingly, protection switch 531 is turned on due to the low level applied to the gate terminal of the protection switch 531 until the time Tl at which the output signal of the protection controller 705 is the low level and is turned off due to the high level applied to the gate terminal of the protection switch 531 after the time Tl at which the output signal of the protection controller 705 is the low level.

Therefore, it is possible to reduce a breakdown phenomenon in case of power off or power down, and thereafter, a level shift operation and the like are stably performed.

Meanwhile, the operation of the level shifter in the signal processor 170 described with reference to FIGS. 5 to 8 is applicable to various analog circuits.

For example, it is applicable to any analog circuit in which the power level of an input signal is greater than the internal allowable power level.

Figure 9:
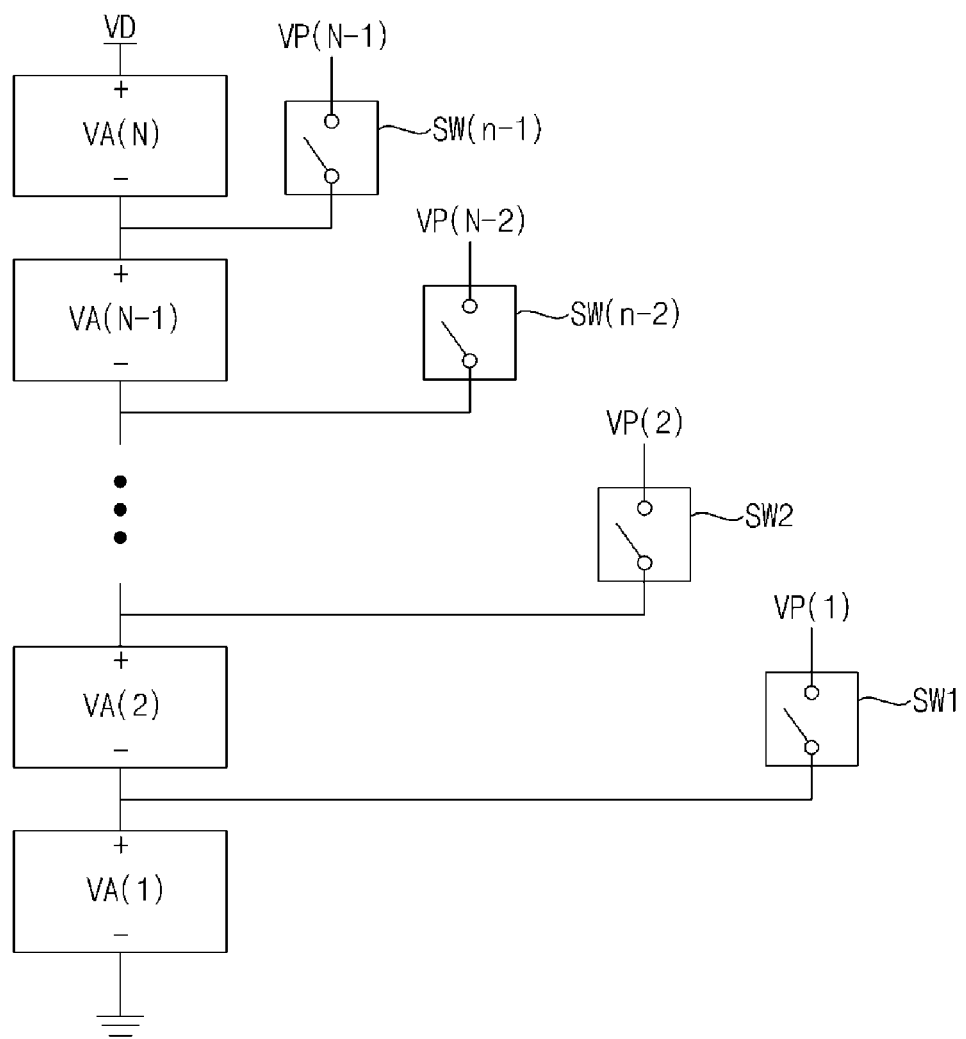
FIG. 9 illustrates a plurality of logic circuits and a signal processing circuit including a protection control circuit disposed between level shifters.

FIG. 9 illustrates a signal processing circuit including a plurality of logic circuits and a protection control circuit disposed between level shifters.

Referring to the figure, the plurality of logic circuits VA(1) to VA(N) are serially connected, and may divide the voltage level of an input signal in series and shift the levels.

Accordingly, the plurality of logic circuits VA(1) to VA(N) may be referred to as a plurality of level shifters.

Each of the protection control circuits SW1 to SW(n-1) may include the protection switch 531 and the protection controller 532 for controlling the protection switch 531, as described with reference to FIGS. 5 to 8.

When the power level of the input signal is greater than the internal allowable power level, the protection switch 531 is turned on when the protection controller 532 is powered off or powered down. Accordingly, it is possible to reduce a breakdown phenomenon in case of power off or power down. Therefore, it is possible to protect the internal circuit elements.

When the operation power VDDH for operating an adjacent second logic circuit 522 is applied and the operation power VDD_core is not applied to the protection controller 532 while the operation power VDD for operating the protection switch 531 is applied, the protection switch 531 may be turned on. Accordingly, it is possible to reduce the breakdown phenomenon in case of power off or power down.

When the operation power VDD for operating the protection switch 531, the operation power VDDH for operating the second logic circuit 522, and the operation power VDD_core for the protection controller 532 are applied, the protection switch 531 may be turned on based on an input digital signal. Accordingly, it is possible to reduce the breakdown phenomenon in case of power off or power down.

Meanwhile, when the operation power VDD for operating the protection switch 531, the operation power VDDH for operating an adjacent second logic circuit 522, and the operation power VDD_core for the protection controller 532 are applied, the protection switch 531 may be turned off. Accordingly, it is possible to reduce the breakdown phenomenon in case of power off or power down.

Figure 10:
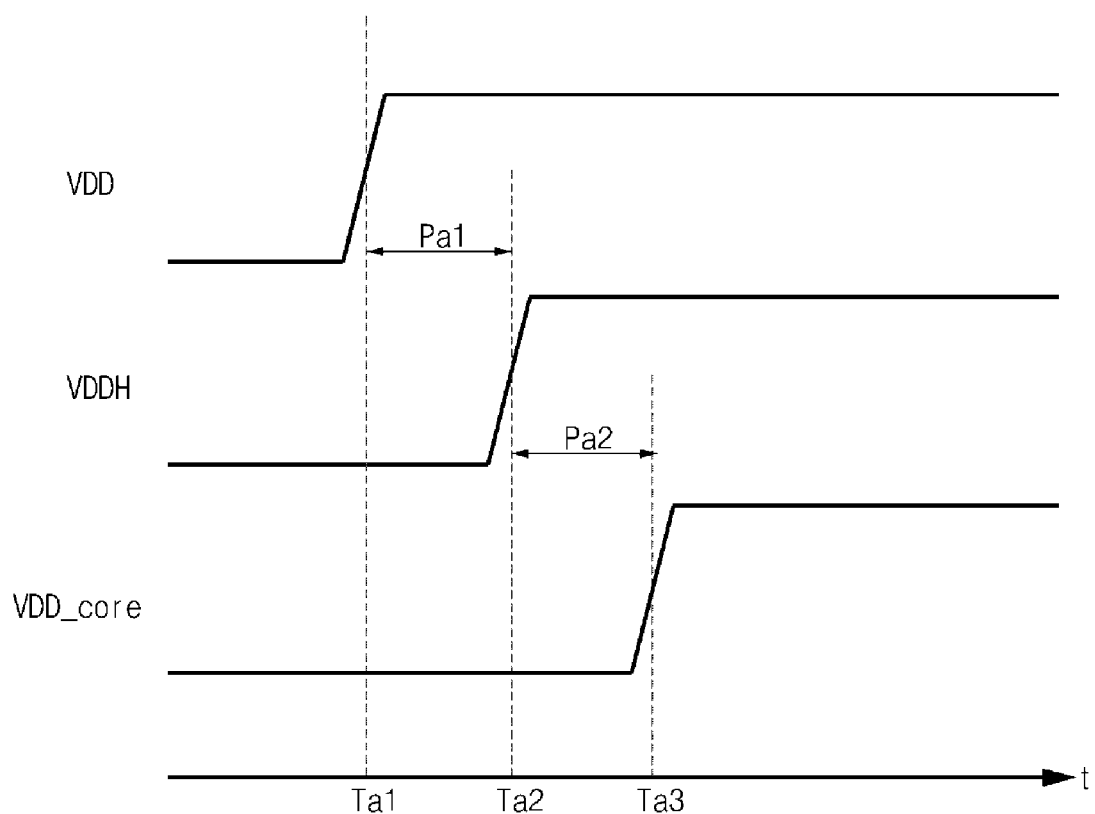
FIG. 10 is a diagram illustrating an example of a power sequence in the signal processing circuit of FIG. 9.

FIG. 10 is a diagram illustrating an example of a power sequence in the signal processing circuit of FIG. 9.

Referring to the figure, VDD may correspond to the operation power of the protection switch 531, VDDH may correspond to the operation power of a second logic circuit 522 for processing a high voltage region, and VDD_core may correspond to the operation power of the protection controller 532.

As shown in the figure, a time difference Pa1 occurs between a time Ta1 at which VDD changes from a low level to a high level and a time Ta2 at which VDDH changes from a low level to a high level, and a time difference Pa2 occurs between the time Ta2 at which VDDH changes from the low level to the high level and a time point Ta3 at which VDD_core changes from a low level to a high level.

Accordingly, when the power sequence is supplied as shown in FIG. 10, the protection controller 532 does not operate normally until the period Pa1+Pa2, and as VDDH is supplied first, a breakdown phenomenon occurs between actual devices.

Therefore, according to an embodiment of the present disclosure, the protection switch 531 is turned on when the protection controller 532 is turned off or powered down. Accordingly, it is possible to reduce the breakdown phenomenon in case of power off or power down. Therefore, it is possible to protect the internal circuit elements.

Meanwhile, when the operation power VDDH for operating the second logic circuit 522 is applied and the operation power VDD_core is not applied to the protection controller 532 while the operation power VDD for operating the protection switch 531 is applied, the protection switch 531 may be turned on. Accordingly, even when the operation power VDD_core is not applied to the protection controller 532, the breakdown phenomenon can be reduced.

With respect to FIG. 9, the operation of the protection controller 532 may be the same as that described with reference to FIGS. 5 to 8.

Figure 11:
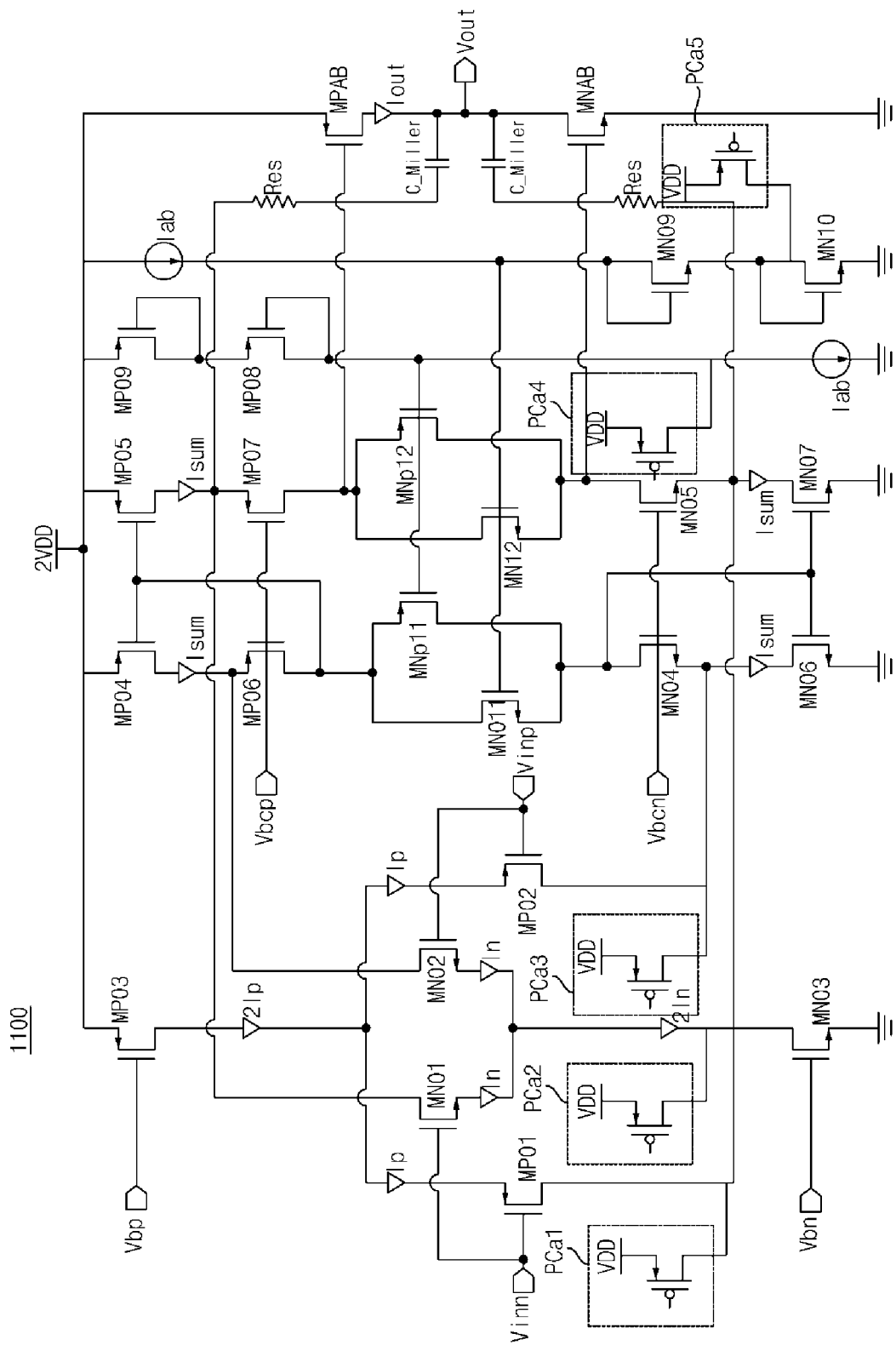
FIG. 11 is an internal circuit diagram of a rail-to-rail operational amplifier.

FIG. 11 is an internal circuit diagram of a rail-to-rail OPAMP 1100.

Referring to the figure, when the power level of a signal input to the rail-to-rail OPAMP 1100 is greater than an internal allowable power level, the operation as described with reference to FIGS. 5 to 8 can be performed.

To this end, the rail-to-rail OPAMP of FIG. 11 may include a plurality of protection control circuits PCa1 to PCa5. Accordingly, it is possible to reduce a breakdown phenomenon in case of power off or power down.

Figure 12:
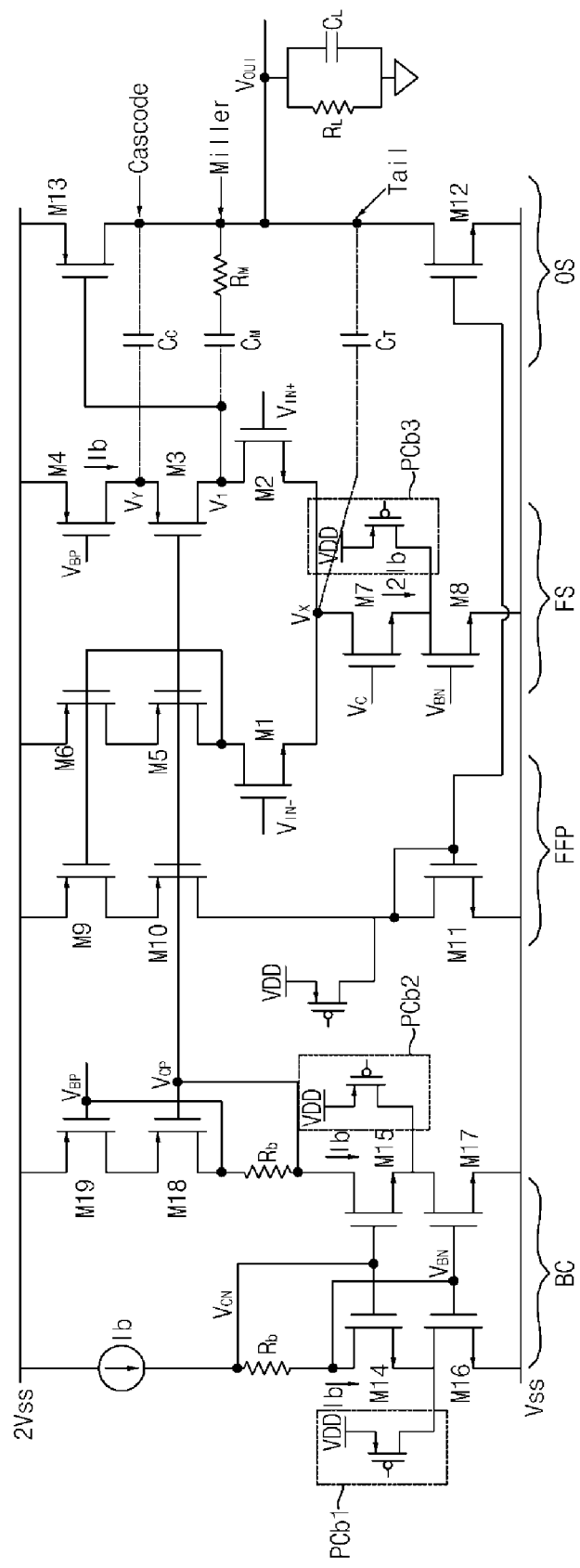
FIG. 12 is an internal circuit diagram of a two-stage operational amplifier.

FIG. 12 is an internal circuit diagram of a 2-stage OPAMP.

Referring to the figure, the 2-stage OPAMP 1200 may include a basic circuit BC, a feed forward circuit FFP, a first stage circuit FS, and an output stage circuit OS. Here, the output stage circuit OS may correspond to the first stage circuit.

Meanwhile, when the power level of a signal input to the 2-stage OPAMP 1200 is greater than an internal allowable power level, the operation described with reference to FIGS. 5 to 8 can be performed.

To this end, the 2-stage OPAMP of FIG. 12 may include a plurality of protection control circuits PCb1 to PCb3. Accordingly, it is possible to reduce a breakdown phenomenon in case of power off or power down.

Meanwhile, as the process of a system on chip (SOC) in which the signal processor 170 is implemented evolves, the allowable voltage of each circuit element decreases, but the power level of an external input signal increases.

Accordingly, when the allowable voltage of each element in the signal processor 170 is exceeded, reliability becomes a major problem due to over-voltage stress.

Meanwhile, since an analog circuit has a circuit off situation, it is necessary to solve a reliability problem due to this situation in a micro-process.

Accordingly, in the present disclosure, the above problem is solved through the protection switch and the protection controller in the protection control circuit.

In particular, since the circuit can be turned off through implementation of the protection switch, it is possible to minimize standby current.

Since the operation of the protection controller is implemented with low current consumption and a small size, it is simpler than any other method.

While the present disclosure has been particularly shown and described with reference to exemplary embodiments thereof, it is clearly understood that the same is by way of illustration and example only and is not to be taken in conjunction with the present disclosure. It will be understood by those skilled in the art that various changes in form and details may be made therein without departing from the subject matter and scope of the present disclosure.

What is claimed is:

1. A signal processing device for processing input signals received from an Ethernet terminal, the signal processing device comprising:
a first logic circuit configured to process a first voltage range among voltage levels of input signal;
a second logic circuit configured to process a second voltage range higher than the first voltage range among the voltage levels of the input signals; and
a protection control circuit disposed between the first logic circuit and the second logic circuit and including a protection switch and a protection controller for controlling the protection switch,
wherein the protection switch is turned on when the protection controller is turned off or powered down, and
wherein the protection switch is turned on when operation power for operating the second logic circuit is applied and operation power is not applied to the protection controller while operation power for operating the protection switch is applied.

2. The signal processing device of claim 1, wherein the protection switch is turned on based on an input digital signal when the operation power for operating the protection switch, the operation power for operating the second logic circuit, and the operation power for the protection controller are applied.

3. The signal processing device of claim 1, wherein the protection switch is turned off when the operation power for operating the protection switch, the operation power for operating the second logic circuit, and the operation power for the protection controller are applied.

4. The signal processing device of claim 1, wherein the protection controller outputs a low-level signal to the protection switch when the operation power for operating the second logic circuit is applied and the operation power is not applied to the protection controller while the operation power for operating the protection switch is applied.

5. The signal processing device of claim 4, wherein the protection controller outputs a signal corresponding to a level of an input digital signal to the protection switch when the operation power for operating the protection switch, the operation power for operating the second logic circuit, and the operation power for the protection controller are applied.

6. The signal processing device of claim 4, wherein the protection controller outputs a high-level signal to the protection switch when the operation power for operating the protection switch, the operation power for operating the second logic circuit, and the operation power for the protection controller are applied.

7. The signal processing device of claim 1, wherein the protection controller includes:
a level shifter to which the operation power for operating the protection controller is supplied;
a switching element configured to perform switching based on the operation power for operating the protection switch; and
a ramp generator configured to output a high-level signal or a low-level signal based on an output of the level shifter,
wherein a control output signal of the protection controller is output as an output signal based on the high-level or low-level signal output from the ramp generator.

8. The signal processing device of claim 7, wherein the ramp generator includes a comparator and logic circuit elements and outputs a low level or a high level based on the operation power for operating the protection controller and the operation power for operating the protection switch.

9. The signal processing device of claim 8, wherein the ramp generator outputs a high level when the operation power for operating the protection switch is applied and the operation power is not applied to the protection controller.

10. The signal processing device of claim 8, wherein the ramp generator outputs a low level when the operation power for operating the protection switch is applied and the operation power is applied to the protection controller.

11. A signal processing device comprising:
- a first logic circuit configured to process a first voltage range among voltage levels of input signals;
- a second logic circuit configured to process a second voltage range higher than the first voltage range among the voltage levels of the input signals; and
- a protection control circuit disposed between the first logic circuit and the second logic circuit and including a protection switch and a protection controller for controlling the protection switch,
- wherein the voltage levels of the input signals are greater than an internal allowable voltage level, and the protection switch is turned on when the protection controller is turned off or powered down, and
- wherein the protection switch is turned on when operation power for operating the second logic circuit is applied and the operation power is not applied to the protection controller.

12. The signal processing device of claim 11, wherein the protection switch is turned on when an input digital signal in case in which the operation power for operating the protection switch, the operation power for operating the second logic circuit, and the operation power for the protection controller are applied.

13. The signal processing device of claim 11, wherein the protection switch is turned off when the operation power for operating the protection switch, the operation power for operating the second logic circuit, and the operation power for the protection controller are applied.

14. An image display apparatus comprising:
- a display; and
- a signal processor configured to output display data to the display,
- wherein the signal processor is configured to process input signals received from an Ethernet terminal,
- wherein the signal processor comprises:
- a first logic circuit configured to process a first voltage range among voltage levels of input signal;
- a second logic circuit configured to process a second voltage range higher than the first voltage range among the voltage levels of the input signals; and
- a protection control circuit disposed between the first logic circuit and the second logic circuit and including a protection switch and a protection controller for controlling the protection switch,
- wherein the protection switch is turned on when the protection controller is turned off or powered down, and
- wherein the protection switch is turned on when operation power for operating the second logic circuit is applied and operation power is not applied to the protection controller while operation power for operating the protection switch is applied.

15. The image display apparatus of claim 14, wherein the protection switch is turned on based on an input digital signal when the operation power for operating the protection switch, the operation power for operating the second logic circuit, and the operation power for the protection controller are applied.

16. The image display apparatus of claim 14, wherein the protection switch is turned off when the operation power for operating the protection switch, the operation power for operating the second logic circuit, and the operation power for the protection controller are applied.

17. The image display apparatus of claim 14, wherein the protection controller outputs a low-level signal to the protection switch when the operation power for operating the second logic circuit is applied and the operation power is not applied to the protection controller while the operation power for operating the protection switch is applied.

* * * * *